United States Patent [19]

Eagan

[11] Patent Number: 5,252,862
[45] Date of Patent: Oct. 12, 1993

[54] BICMOS LOGIC GATE

[75] Inventor: John W. Eagan, Austin, Tex.

[73] Assignee: Motorola, Inc., Schaumburg, Ill.

[21] Appl. No.: 876,253

[22] Filed: Apr. 30, 1992

[51] Int. Cl.⁵ .......................................... H03K 19/02
[52] U.S. Cl. ................................ 307/446; 307/296.6; 307/296.8; 307/570
[58] Field of Search .................. 307/446, 570, 296.6, 307/443, 296.7, 296.8, 456

[56] References Cited

U.S. PATENT DOCUMENTS

| | | | |
|---|---|---|---|
| 4,595,844 | 6/1986 | Shen | 307/571 |
| 4,616,146 | 10/1986 | Lee et al. | 307/446 |
| 4,929,853 | 5/1990 | Kim et al. | 307/451 |
| 5,027,009 | 6/1991 | Urakawa et al. | 307/570 |
| 5,155,392 | 10/1992 | Nogle | 307/443 |

Primary Examiner—Edward P. Westin
Assistant Examiner—Jon Santamauro
Attorney, Agent, or Firm—Daniel D. Hill

[57] ABSTRACT

A BICMOS NAND gate (40) has a CMOS NAND gate (41), a bipolar pull-up transistor (47), a bipolar pull-down transistor (48), series connected N-channel transistors (43-45) coupled between the base and collector of pull-down transistor (48), N-channel transistors (42, 46, 49, and 50), and a $V_{BG}$ generated reference voltage (51). N-channel transistor (46) receives a variable bias voltage provided by transistors 49, 50, and $V_{BG}$ generated reference voltage (51). At high power supply voltages, N-channel transistor (46) prevents pull-down transistor (48) from becoming saturated when BICMOS NAND gate (40) is operating at high frequency, when an input becomes skewed, or a glitch develops, yet allows for satisfactory operation BICMOS NAND gate (40) at low power supply voltages.

15 Claims, 2 Drawing Sheets

BICMOS LOGIC GATE

FIELD OF THE INVENTION

This invention relates generally to logic circuits, and more particularly, to BICMOS logic gates.

BACKGROUND OF THE INVENTION

BICMOS circuits are constructed by including bipolar transistors and complementary metal-oxide-semiconductor (CMOS) transistors on the same integrated circuit. Bipolar transistors are often used as output devices in BICMOS circuits to provide high output current, while CMOS transistors are used in the logic elements because of their low power operation. Therefore, a BICMOS logic circuit can operate at high speed without consuming a large amount of power.

FIG. 1 illustrates in partial schematic form and partial logic diagram form a prior art BICMOS NAND gate 20. BICMOS NAND gate 20 includes a three input CMOS NAND gate 21, N-channel transistors 22-25, and NPN transistors 27 and 28. CMOS NAND gate 21 receives input logic signals labeled "$A_X$", "$A_Y$", and "$A_Z$", and provides an internal logic signal at a node labeled "N101". N-channel transistor 22 has a drain connected to a node labeled "N102", a gate connected to the output of CMOS NAND gate 21 at node N101, and a source connected to a negative power supply voltage terminal labeled "$V_{SS}$". NPN transistor 27 has a collector connected to a positive power supply voltage terminal labeled "$V_{DD}$", a base for receiving the internal logic signal from CMOS NAND gate 21 at node N101, and an emitter for providing an output signal labeled "$V_{OUT}$". N-channel transistor 23 has a drain connected to the emitter of transistor 27, a gate for receiving signal $A_X$, and a source. N-channel transistor 24 has a drain connected to the source of transistor 23, a gate for receiving signal $A_Y$, and a source. N-channel transistor 25 has a drain connected to the source of transistor 24, a gate for receiving signal $A_Z$, and a source connected to the drain of transistor 22 at node N102. NPN transistor 28 has a collector connected to the emitter of transistor 27, a base connected to the source of transistor 25 at node N102, and an emitter connected to $V_{SS}$.

BICMOS NAND gate 20 provides output signal $V_{OUT}$ as a logical NAND of input signals $A_X$, $A_Y$, and $A_Z$ at BICMOS levels. When at least one of signals $A_X$, $A_Y$, and $A_Z$ is a logic low input to CMOS NAND gate 21, output signal $V_{OUT}$ is a logic high. Only if all of input signals $A_X$, $A_Y$, and $A_Z$ are a logic high will $V_{OUT}$ be a logic low. The logic high voltage of output signal $V_{OUT}$ is equal to $V_{DD}$, which is the logic high output of CMOS NAND gate 21, minus one base-emitter voltage drop ($V_{BE}$) across bipolar transistor 27. The logic low voltage is approximately equal to a $V_{BE}$ above $V_{SS}$. $V_{DD}$ is nominally 5.0 volts, and $V_{SS}$ is the system ground. But $V_{DD}$ may range from 3.0 volts to 7.0 volts depending on the application. Also, $V_{DD}$ may be the system ground and $V_{SS}$ equal to a negative power supply voltage. NPN transistor 27 is known in the art as a "pull-up" transistor, and NPN transistor 28 is known as a "pull-down" transistor.

For the case in which $V_{DD}$ is equal to 5.0 volts and CMOS NAND gate 21 applies a logic high of 5 volts to the base of bipolar transistor 27 at node N101, the $V_{BE}$ of transistor 27 of about 0.8 volts will cause output signal $V_{OUT}$ to be a logic high of approximately 4.2 volts. For the case in which CMOS NAND gate 21 provides a logic high output, at least one of transistors 23-25 will be non conductive, and transistor 22 will be conductive in response to the logic high at node N101, to discharge the base of transistor 28 and cause transistor 28 to be switched off.

For the case in which all of input signals $A_X$, $A_Y$, and $A_Z$ are a logic high, the output of CMOS NAND gate 21 at node N101 is a logic low. Transistor 27 is off (non conductive) and output signal $V_{OUT}$ is a logic low. All of series connected N-channel transistors 23-25 are conductive, thus clamping the base and collector of transistor 28 so that transistor 28 is base-emitter forward biased, causing output signal $V_{OUT}$ to be pulled to a logic low. Transistor 22 receives a logic low at its gate causing transistor 22 to be non conductive. The base-emitter voltage of transistor 28 is equal to approximately 0.8 volts and transistor 28 is conductive, until $V_{OUT}$ reaches about 0.8 volts. As $V_{OUT}$ drops further, node N102 will no longer be a $V_{BE}$ so that transistor 28 becomes non conductive. Thus, $V_{OUT}$ at a logic low is about a $V_{BE}$ above $V_{SS}$.

A problem may occur with prior art BICMOS NAND gate 20 of FIG. 1 when operating at high frequency, or if the inputs become skewed, or glitched. The problem occurs when $A_Y$ and $A_Z$ are at a logic high and $A_X$ is a logic low and a sharp positive pulse appears at the gate of transistor 23. Because transistors 24 and 25 are already on (conductive), node N102 will be pulled high by the input glitch. The output of CMOS NAND gate 21 becomes a logic low making transistor 27 non conductive. Output signal $V_{OUT}$ will be pulled to a logic low because series connected transistors 23-25 cause transistors 28 to be switched on. As the sharp positive pulse, or glitch, falls, transistor 23 becomes non conductive and the output of CMOS NAND gate 21 becomes a logic high. However, the stored capacitance of transistors 24 and 25 prevents the voltage at node N102 from dropping, which causes transistor 28 to continue to conduct until the stored capacitance of transistors 24 and 25 has been exhausted. Transistor 28 may even be biased into saturation if output signal $V_{OUT}$ is pulled below the base voltage of transistor 28 before the stored charge on transistors 24 and 25 is depleted. If transistor 28 becomes saturated, large crowbar currents can result. This hinders output signal $V_{OUT}$ from transitioning back to a logic high state. Transistor 22 will eventually help to pull node N102 back down to $V_{SS}$, but there is an undesirable delay because node N101 must also return to a logic high before transistor 22 can become conductive. The problem can occur whenever any two of transistors 23-25 are at a logic high and there is an input glitch on the third transistor. However, the problem is most severe when the input glitch occurs on transistor 23 because the stored charge of both transistors 24 and 25 is coupled to the base of transistor 28.

FIG. 2 illustrates in partial schematic form and partial logic diagram form a second prior art BICMOS NAND gate 30. In FIG. 2, the same reference numerals are assigned to corresponding elements of the circuit illustrated in FIG. 1. BICMOS NAND gate 30 includes N-channel transistor 26 to correct the problem caused by an input glitch, as addressed above with the prior art BICMOS NAND gate 20. N-channel transistor 26 has a drain connected to the base of transistor 28 at node N102, a gate connected to $V_{DD}$, and a source connected to $V_{SS}$.

Transistor 26 prevents transistor 28 from going into saturation when an input glitch occurs at the gate of transistor 23 by shunting the excess charge on the base of transistor 28 to $V_{SS}$. This allows output signal $V_{OUT}$ to quickly return to a logic high after the input glitch subsides. The problem with transistor 28 being biased into saturation only occurs at high $V_{DD}$, i.e. when $V_{DD}$ is greater than approximately 5 volts. Below approximately 5 volts, there is not enough current through the stack of series connected transistors 23-25 to bias transistor 28 into saturation. The problem with BICMOS NAND gate 30 is that at low $V_{DD}$ (below approximately 5 volts), transistor 26 conducts too much current, which impedes transistor 28 from becoming conductive. This hinders output signal $V_{OUT}$ from transitioning from a logic high to a logic low.

SUMMARY OF THE INVENTION

Accordingly, there is provided, in one form, a BICMOS logic gate, having a logic portion, first and second bipolar transistors, a controllable conduction portion, a discharge portion, and a shunt portion. A first power supply voltage terminal receives a first power supply voltage having an upper limit and a lower limit. A second power supply voltage terminal receives a second power supply voltage. The logic portion receives a plurality of input signals, and in response, provides an internal logic signal. The first bipolar transistor has a collector coupled to a first power supply voltage terminal, a base for receiving the internal logic signal, and an emitter for providing an output signal. The second bipolar transistor has a collector coupled to the emitter of the first bipolar transistor, a base, and an emitter coupled to a second power supply voltage terminal. The controllable conduction portion is responsive to the plurality of input signals, and provides a conductive path between the collector and the base of the second bipolar transistor. The discharge portion is responsive to the internal logic signal, and provides a conductive discharge path between the base and the emitter of the second bipolar transistor when the first bipolar transistor is switched on. The shunt portion is responsive to a reference voltage proportional to the first power supply voltage and provides a conductive path between the base of the second bipolar transistor and the second power supply voltage terminal when the power supply voltage is at the upper limit. When the first power supply voltage is at the lower limit, the shunt portion is substantially non conductive.

DESCRIPTION OF THE PREFERRED EMBODIMENT

Figure 3:
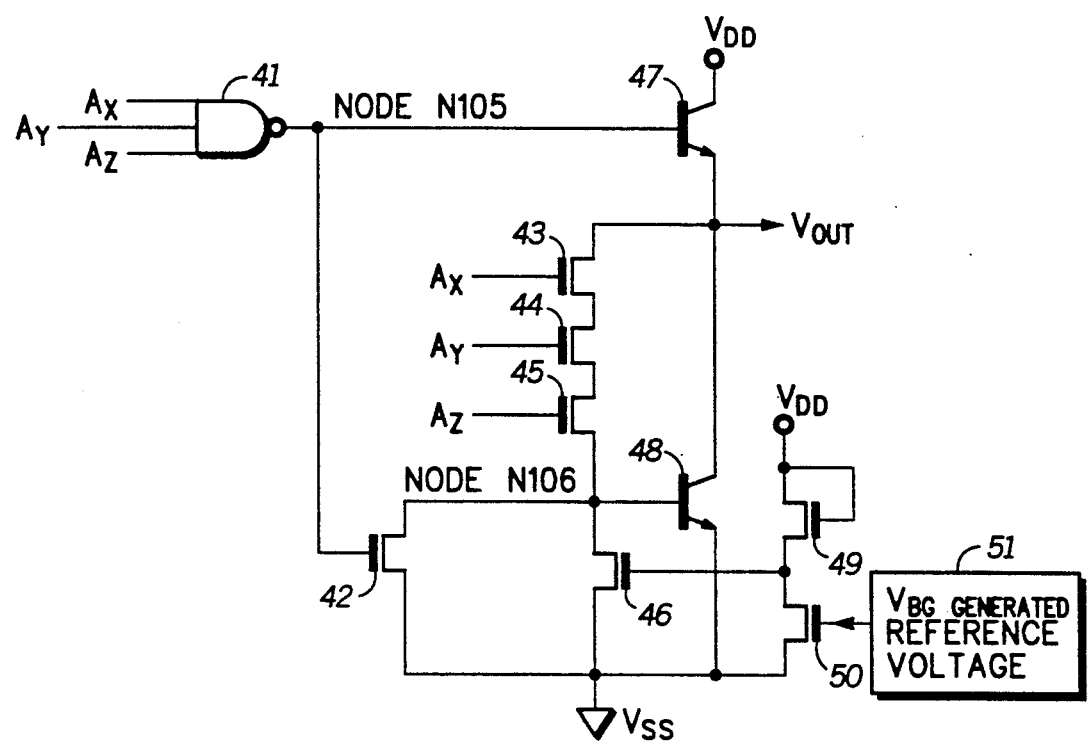
FIG. 3 illustrates in partial schematic form and partial logic diagram form a BICMOS NAND gate which is more resistant to input glitches in accordance with the present invention.

FIG. 3 illustrates in partial schematic form and partial logic diagram form a BICMOS NAND gate 40 which is more resistant to input glitches in accordance with the present invention. BICMOS NAND gate 40 includes CMOS NAND gate 41, N-channel transistors 42–46, 49, and 50, NPN transistors 47 and 48, and $V_{BG}$ generated reference voltage circuit 51. CMOS NAND gate 41 receives input logic signals labeled "$A_X$", "$A_Y$", and "$A_Z$", and provides an internal logic signal at a node labeled "N105". The number of inputs of CMOS NAND gate 40 is not critical to the invention, and can be any number. N-channel transistor 42 has a drain connected to a node labeled "N106", a gate connected to the output of NAND gate 41 at node N105, and a source connected to $V_{SS}$. NPN transistor 47 has a collector connected to a positive power supply voltage terminal labeled "$V_{DD}$", a base connected to the output of NAND gate 41 at node N105, and an emitter for providing output signal labeled "$V_{OUT}$". N-channel transistor 43 has a drain connected to the emitter of transistor 47, a gate for receiving signal $A_X$, and a source. N-channel transistor 44 has a drain connected to the source of transistor 43, a gate for receiving signal $A_Y$, and a source. N-channel transistor 45 has a drain connected to the source of transistor 44, a gate for receiving signal $A_Z$, and a source connected to the drain of transistor 42 at node N106. N-channel transistor 46 has a drain connected to the source of transistor 45 at node 106, a gate, and a source connected to a negative power supply voltage terminal labeled "$V_{SS}$". NPN transistor 48 has a collector connected to the emitter of transistor 47, a base connected to the source of transistor 45 at node N106, and an emitter connected to $V_{SS}$. N-channel transistor 49 has a drain connected to $V_{DD}$, a gate connected to $V_{DD}$, and a source connected to the gate of transistor 46. N-channel transistor 50 has a drain connected to the source of transistor 49, a gate, and a source connected to $V_{SS}$. $V_{BG}$ generated reference voltage 51, labeled "$V_{BG}$ generated reference voltage", represents a circuit that provides a bias voltage to the gate of transistor 50. The bias voltage to the gate of transistor 50 is based on a conventional bandgap generated reference voltage ($V_{BG}$). A $V_{BG}$ reference voltage biases a conventional constant current circuit which in turn provides a bias voltage to transistor 50. The number of series connected transistors 43–45 is the same as the number of inputs of CMOS NAND gate 41. $V_{DD}$ is nominally 5.0 volts, and $V_{SS}$ is the system ground. But $V_{DD}$ may range from 3.0 volts to 7.0 volts depending on the application. Also, $V_{DD}$ may be the system ground and $V_{SS}$ may be equal to a negative power supply voltage.

BICMOS NAND gate 40 operates similarly to prior art BICMOS NAND gates 20 and 30 when $V_{OUT}$ is to be a logic high. CMOS NAND gate 41 provides a logic high output at node N105, transistor 47 will be base-emitter forward biased and output signal $V_{OUT}$ will be a logic high equal to the voltage at node N105 minus one $V_{BE}$. The base-emitter voltage drop ($V_{BE}$) of transistor 47 is about 0.8 volts. In this case, at least one of transistors 43–45 will be non conductive, and transistor 42 will be conductive in response to the logic high at node N105, to discharge the base of "pull-down" bipolar transistor 48 and cause transistor 48 to be switched off (non conductive).

For the case in which $V_{DD}$ is above approximately 5 volts and all of input signals $A_X$, $A_Y$, and $A_Z$ are a logic high, the output of CMOS NAND gate 41 at node N105 is a logic low. All of series connected N-channel transistors 43–45 are conductive, thus clamping the base and collector of transistor 48 so that transistor 48 is base-emitter forward biased. Transistor 47 is off (non-conductive) and output signal $V_{OUT}$ is pulled to a logic low by transistor 48. Transistor 42 receives a logic low at its gate, thus causing transistor 42 to be non-conductive. Transistor 46 is conductive, pulling node N106 low. As $V_{OUT}$ drops further, node N106 will no longer be a $V_{BE}$ so that transistor 48 becomes non-conductive. Transistor 46 continues to pull $V_{OUT}$ to a logic low voltage equal to approximately $V_{SS}$.

Figure 1:
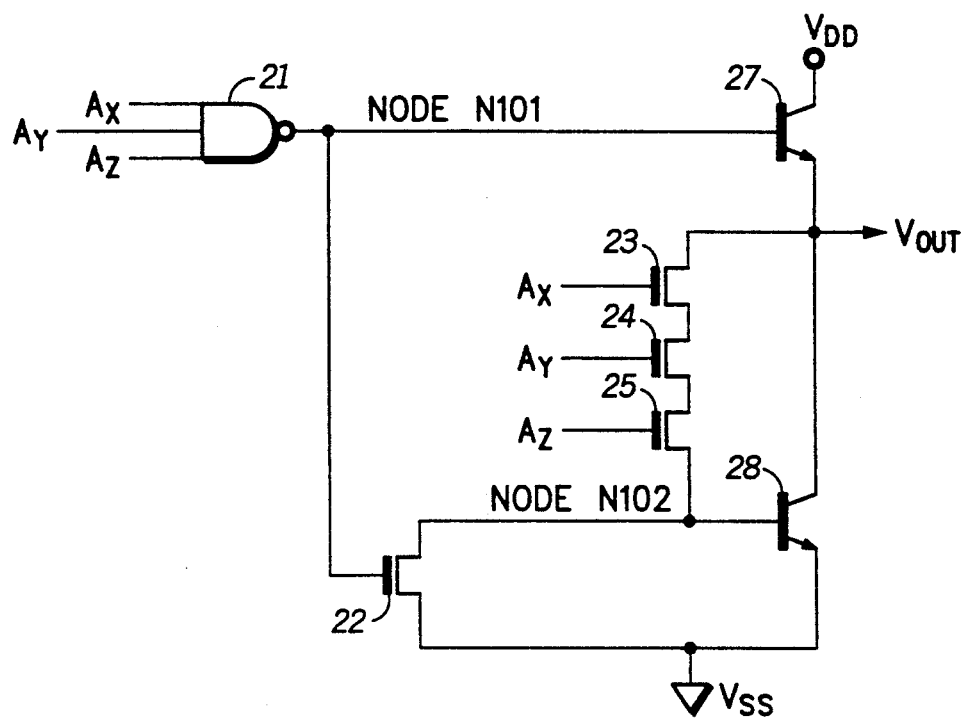
FIG. 1 illustrates in partial schematic form and partial logic diagram from a prior art BICMOS NAND gate.
Figure 2:
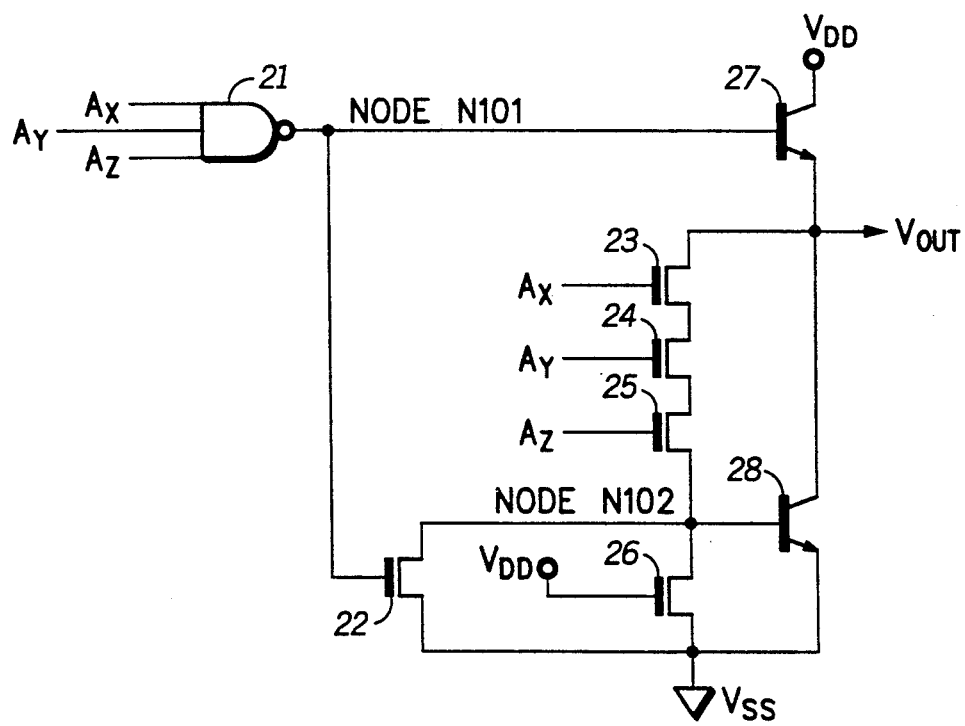
FIG. 2 illustrates in partial schematic form and partial logic diagram form a second prior art BICMOS NAND gate.

At high $V_{DD}$, transistor 46 provides a conductive path from node N106 to $V_{SS}$ in the same way that transistor 26 of BICMOS NAND gate 30 shunts the current from node N102 in FIG. 2. But at low $V_{DD}$, when there is little danger of transistor 28 becoming saturated because of an input glitch, transistor 46 becomes less conductive so that BICMOS NAND gate 40 of FIG. 3 operates substantially the same as BICMOS NAND gate 20 of FIG. 1 at low $V_{DD}$. Transistor 46 is sized large enough to shunt enough current so that transistor 48 will not go into saturation. Transistor 46 becomes less conductive as $V_{DD}$ decreases, so that the switching time of transistor 48 is not adversely affected at low $V_{DD}$.

The voltage provided at the gate of transistor 46 is equal to $V_{DD}$ minus the gate-to-source voltage ($V_{GS}$) of transistor 49, since transistor 49 is diode connected. Transistor 46 is conductive when it receives a voltage at its gate that is greater than its threshold voltage ($V_{TN}$). $V_{TN}$ is defined as the voltage required to cause a conducting channel to be formed between the source and drain of an N-channel transistor. The voltage received at the gate of transistor 46 depends on the conductivity of transistor 49 and the current flowing therethrough. As the size of transistor 49 is decreased, its conductivity is decreased. Transistor 49 is sized, in conjunction with choosing the current therethrough, so that transistor 46 becomes substantially non-conductive as $V_{DD}$ decreases to approximately 3 volts. As $V_{DD}$ increases, output signal $V_{OUT}$ and input signals $A_X$, $A_Y$, and $A_Z$ increase when they are a logic high. Also, the conductivity of transistors 43 and 49 both track changes in voltage, temperature, and process variations in the same way. For example, if transistor 43 becomes more conductive because $V_{DD}$ increases, transistor 49 will also become more conductive, providing a higher bias voltage to transistor 46. Transistor 46 therefore shunts more current preventing transistor 48 from becoming saturated.

Transistor 50 provides a constant current source for transistor 49. In the illustrated embodiment, the gate of transistor 50 is biased by a conventional $V_{BG}$ generated reference voltage 51 so that transistor 50 provides a precision constant current source. A bandgap reference voltage is substantially independent of changes in power supply voltage, temperature, and processing. The amount of drain to source current through transistor 50 is chosen depending on the capacitance of transistor 46 and the reaction time required by the particular application. The $V_{TN}$ of transistor 46 will be about 0.8 volts. Transistor 49 and 50 must be sized so that when $V_{DD}$ is equal to approximately 3.0 volts, the voltage on the gate of transistor 46 is about equal to 0.8 volts so that transistor 46 is substantially non conductive.

Figure 4:
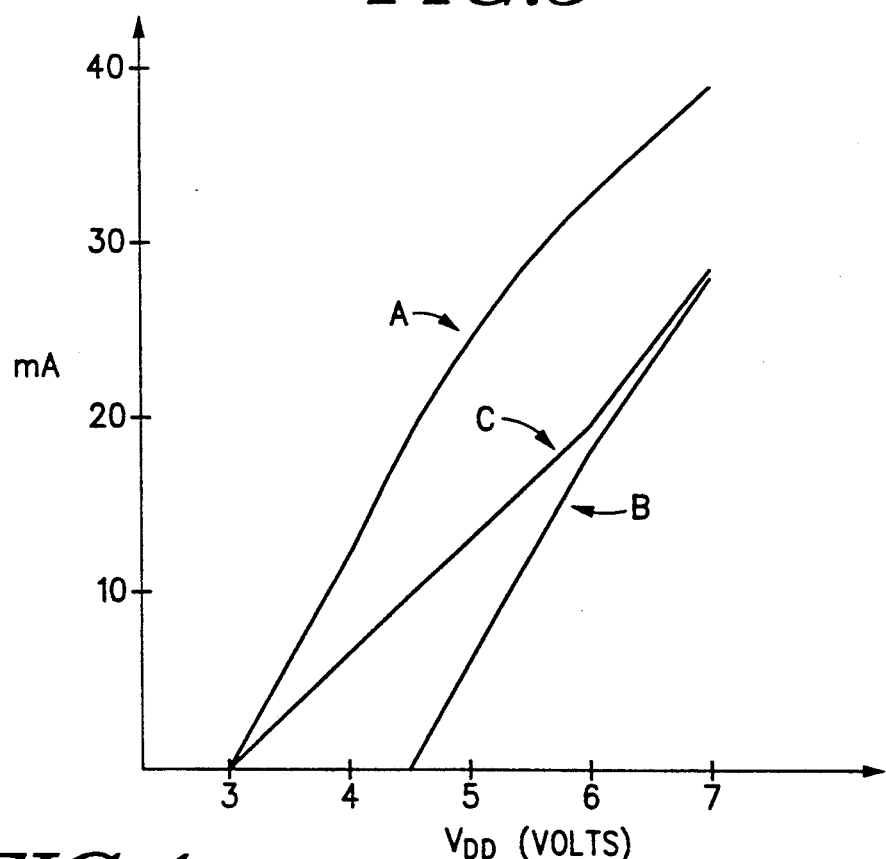
FIG. 4 shows a graph comparing the pull-down transistor emitter currents of the BICMOS NAND gates of FIG. 1, FIG. 2, and FIG. 3 for a range of power supply voltages.

FIG. 4 shows a graph comparing the peak switching emitter currents of the pull-down bipolar transistors of the BICMOS logic gates of FIG. 1, FIG. 2, and FIG. 3 for a range of power supply voltages at the time at which the output of the BICMOS NAND gate switches from a logic high to a logic low. Curve A is the emitter current of pull-down bipolar transistor 28 of BICMOS NAND gate 20 of FIG. 1 as BICMOS NAND gate 20 switches from a logic high to a logic low at different power supply voltages. As $V_{DD}$ increases from approximately 3.0 volts to 7.0 volts, the emitter current of transistor 28 of FIG. 1 increases from approximately 0 mA to approximately 45 mA.

Curve B is the emitter current of bipolar transistor 28 of BICMOS NAND gate 30 of FIG. 2 as BICMOS NAND gate 30 switches from a logic high to a logic low at different power supply voltages. As $V_{DD}$ increases from 4.5 volts to 7.0 volts, the emitter current of transistor 28 of FIG. 2 increases from approximately 0 mA to approximately 30 mA. The emitter current of transistor 28 of FIG. 2, represented by curve B, illustrates that there is not enough emitter current at low $V_{DD}$ to allow output signal $V_{OUT}$ to transition quickly from a logic high to a logic low. Most of the current provided to the base of transistor 28 is being shunted to $V_{SS}$ by transistor 26 because transistor 26 is conductive for the full range of the power supply voltages, $V_{DD}$, and has a full $V_{DD}$ level on its gate.

Curve C is the emitter current of bipolar transistor 48 of BICMOS NAND gate 40 of FIG. 3, in accordance with the present invention, as gate 40 switches from a logic high to a logic low for a range of power supply voltages. As $V_{DD}$ increases from 3.0 volts to 7.0 volts, the emitter current of transistor 48 of BICMOS NAND gate 40 increases from 0 mA to 30 mA. At low power supply voltages, transistor 46 becomes almost non conductive so that most of the current flows through transistor 48. Output signal $V_{OUT}$ is therefore able to transition from a logic high to a logic low. At high power supply voltages, the emitter current of transistor 48 is reduced because some of the current is shunted through transistor 46, but not enough to adversely affect the operation of BICMOS NAND gate 40.

While the invention has been described in the context of a preferred embodiment, it will be apparent to those skilled in the art that the present invention may be modified in numerous ways and may assume many embodiments other than that specifically set out and described above. For example, a CMOS NAND gate is illustrated in the preferred embodiment, but other logic gates can be easily adapted to use the invention. Also, other types of current sources can be used in place of transistor 50 and $V_{BG}$ generated reference voltage 51. Accordingly, it is intended by the appended claims to cover all modifications of the invention which fall within the true spirit and scope of the invention.

I claim:

1. A BICMOS logic gate, comprising:
   a first power supply voltage terminal for receiving a first power supply voltage having an upper and a lower limit;
   a second power supply voltage terminal for receiving a second power supply voltage;
   logic means for receiving a plurality of input signals and providing an internal logic signal in response thereto;
   a first bipolar transistor having a collector coupled to said first power supply voltage terminal, a base for receiving said internal logic signal, and an emitter for providing an output signal;

a second bipolar transistor having a collector coupled to said emitter of said first bipolar transistor, a base, and an emitter coupled to a second power supply voltage terminal;

controllable conduction means, responsive to said plurality of input signals, for providing a conductive path between said collector and said base of said second bipolar transistor;

discharge means, responsive to said internal logic signal, for providing a conductive discharge path between said base and said emitter of said second bipolar transistor when said first bipolar transistor is conductive; and shunting means, responsive to a reference voltage proportional to said first power supply voltage, for providing a conductive path between said base of said second bipolar transistor and said second power supply voltage terminal when said first power supply voltage is at said upper limit, and being substantially non-conductive when said first power supply voltage is at said lower limit.

2. The BICMOS logic gate of claim 1, wherein said logic means comprises a CMOS NAND gate.

3. The BIOMOS logic gate of claim 1, wherein said controllable conduction means comprises a plurality of series connected N-channel transistors coupled between said collector and said base of said second bipolar transistor, each of said series connected N-channel transistors having a gate for receiving one of said plurality of input signals.

4. The BICMOS logic gate of claim 1, wherein said discharge means comprises an N-channel transistor having a drain coupled to said base of said second bipolar transistor, a gate for receiving said internal logic signal, and a source coupled to said second power supply voltage terminal.

5. The BICMOS logic gate of claim 1, wherein said shunting means comprises:

a first N-channel transistor having a drain coupled to said base of said second bipolar transistor, a gate, and a source coupled to said second power supply voltage terminal;

a second N-channel transistor having a drain and a gate coupled to said first power supply voltage terminal, and a source coupled to said gate of said first N-channel transistor; and a current source having a first terminal coupled to said source of said second N-channel transistor and a second terminal coupled to said second power supply voltage terminal.

6. The BICMOS logic gate of claim 5, wherein said current source is an N-channel transistor having a drain connected to said source of said second N-channel transistor, a gate for receiving a bias voltage, and a source connected to said second power supply voltage terminal.

7. The BICMOS logic gate of claim 6, wherein said current source is characterized as being a bandgap referenced current source.

8. A BICMOS logic gate, comprising:

a positive power supply voltage terminal for receiving a positive power supply voltage having an upper and a lower limit;

a negative power supply voltage terminal for receiving a negative power supply voltage;

a CMOS logic gate for receiving a plurality of input signals and providing an internal logic signal;

a pull-up bipolar transistor having a collector coupled to said positive power supply voltage terminal, a base for receiving said internal logic signal, and an emitter for providing an output signal;

a pull-down bipolar transistor having a collector coupled to said emitter of said pull-up bipolar transistor, a base, and an emitter coupled to said negative power supply voltage terminal;

at least one series connected MOS transistor connected between said collector and said base of said pull-down transistor having a gate for receiving one of said input signals;

a first MOS transistor having a drain connected to the base of said pull-down transistor, a source connected to the emitter of said pull-down transistor, and a gate for receiving said internal logic signal; and a second MOS transistor having a drain connected to the base of said pull-down transistor, a source connected to the emitter of said pull-down transistor, and a gate for receiving a bias voltage between said positive and said negative power supply voltage and proportional to said positive power supply voltage, for providing a conductive path between said base and said negative power supply voltage terminal when said positive power supply voltage is at said upper limit, and substantially non conductive when said positive power supply voltage is at said lower limit.

9. The BICMOS logic gate of claim 8, wherein said CMOS logic gate is a three input CMOS NAND gate.

10. The BICMOS logic gate of claim 8, wherein said CMOS logic gate is a CMOS inverter.

11. The BICMOS logic gate of claim 8, wherein said at least one series connected MOS transistor comprises three series connected N-channel transistors and said first and second MOS transistors are first and second N-channel transistors, respectively.

12. The BICMOS logic gate of claim 11, wherein said bias voltage is provided by a third N-channel transistor having a drain and a gate coupled to said positive power supply voltage terminal, and a source; and a current source having a first terminal coupled to said source of said third N-channel transistor and a second terminal coupled to said negative power supply voltage terminal.

13. A BICMOS NAND gate, comprising:

a CMOS NAND gate for receiving first, second, and third input signals and providing an internal logic signal;

a first NPN transistor having a collector connected to a positive power supply voltage terminal, a base connected to said output of said CMOS NAND gate, and an emitter for providing an output signal;

a first N-channel transistor having a drain, a gate for receiving said internal logic signal, and a source connected to a negative power supply voltage terminal;

a second N-channel transistor having a drain connected to the emitter of said first NPN transistor, a gate for receiving said first input signal, and a source;

a third N-channel transistor having a drain connected to the source of said second N-channel transistor, a gate for receiving said second input signal, and a source;

a fourth N-channel transistor having a drain connected to the source of said third N-channel transistor, a gate for receiving said third input signal, and a source connected to the drain of said first N-channel transistor;

a fifth N-channel transistor having a drain connected to the source of said fourth N-channel transistor, a gate, and a source connected to said negative power supply voltage terminal;

a second NPN transistor having a collector connected to the emitter of said first NPN transistor, a base connected to the drain of said fifth N-channel transistor, and a source connected to said negative power supply voltage terminal;

a sixth N-channel transistor having a drain and a gate connected to said positive power supply voltage terminal and a source connected to the gate of said fifth N-channel transistor; and a current source having a first terminal coupled to the source of said sixth N-channel transistor and a second terminal coupled to said negative power supply voltage terminal.

14. The BICMOS NAND gate of claim 13, wherein said current source comprises a seventh N-channel transistor having a drain connected to said source of said sixth N-channel transistor, a gate for receiving a bias voltage, and a source connected to said negative power supply voltage terminal.

15. The BICMOS NAND gate of claim 14, wherein said current source is characterized as being a bandgap reference current source.

* * * * *